United States Patent

Boyle

[15] 3,698,075

[45] Oct. 17, 1972

[54] ULTRASONIC METALLIC SHEET-FRAME BONDING

[72] Inventor: Donald Francis Boyle, Scottsdale, Ariz.

[73] Assignee: Motorola, Inc., Franklin Park, Ill.

[22] Filed: Nov. 5, 1969

[21] Appl. No.: 874,343

[52] U.S. Cl. ....................29/470.1, 29/471.1, 29/589

[51] Int. Cl. ..............................................B23k 21/00

[58] Field of Search.......29/423, 470.1, 470.3, 471.1, 29/471.3, 589, 590, 591; 228/1

[56] References Cited

UNITED STATES PATENTS

| | | | |
|---|---|---|---|
| 3,255,511 | 6/1966 | Weissenstern et al. | 29/589 |
| 3,257,721 | 6/1966 | Jones | 29/470.1 |
| 3,330,026 | 7/1967 | Best et al. | 29/591 X |
| 3,341,935 | 9/1967 | Bolomuth | 29/470 |
| 3,360,849 | 1/1968 | Forman et al. | 29/470.1 |
| 3,374,537 | 3/1968 | Doelp, Jr. | 29/471.1 X |
| 3,436,810 | 4/1969 | Kauffman | 29/591 X |
| 3,475,814 | 11/1969 | Santangini | 29/589 |
| 3,487,541 | 1/1970 | Boswell | 29/591 X |
| 3,469,684 | 9/1969 | Keady et al. | 29/626 X |
| 3,440,027 | 4/1969 | Hugle | 29/627 X |
| 3,544,857 | 12/1970 | Byrne et al. | 29/627 X |

*Primary Examiner*—John F. Campbell
*Assistant Examiner*—Ronald J. Shore
*Attorney*—Mueller, Aichele & Gillman

[57] ABSTRACT

In simultaneously bonding all the bonding pads of an integrated circuit chip to respective inwardly extending leads comprising parts of an unsupported metallic sheet-frame, a chip bearing the integrated circuit is positioned with its pads in contact with the ends or tips of the leads, comprising part of the frame, on a bonding post. The contacting flat tip of a bonding needle is pressed against the back of the chip to squeeze the ends of the leads and the pads together and the bonding needle is vibrated to cause rubbing motion between the tips of the leads and the bonding pads thereby to bond the ends of the leads to their respective pads. To make sure that the vibrating force is applied to the chip, the flat tip of the steel needle has a layer of soft metal such as copper deposited thereon. To make sure that the ends of the leads do not move and yet to prevent cutting through the leads, the top of the post is not serrated but is roughened as by vapor honing. The tips of the leads are thinned by the squeezing action. The honing also puts a slight curvature on the edges of the posts that are in contact with the leads, whereby a curvature is imparted to the leads at the junction of the thinned and unthinned portions thereof, whereby the leads are weakened at this junction to a lesser extent than in the prior art. The working tip of the post is made hollow to concentrate the compressive force to the area where the leads are in contact with the bonding pads, thereby requiring less pressure on the needle.

7 Claims, 7 Drawing Figures

PATENTED OCT 17 1972 3,698,075
Fig. 1
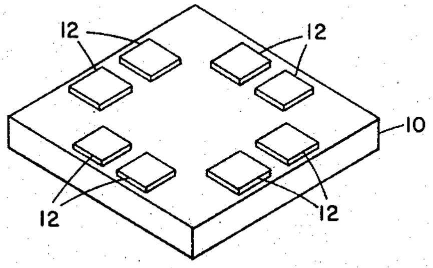
Fig. 2
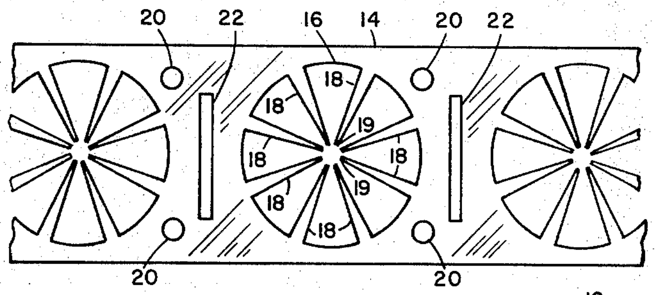
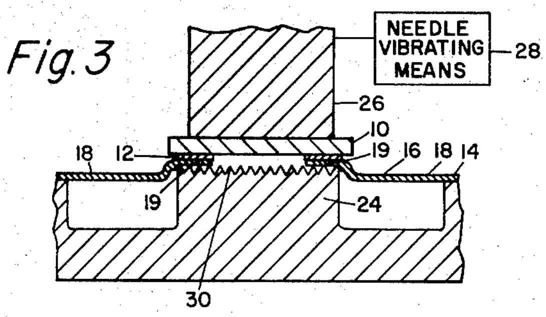
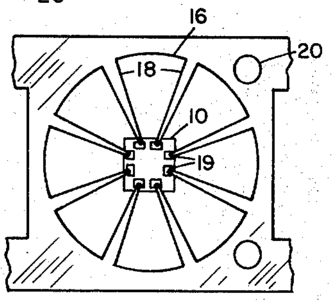
Fig. 4
Fig. 5
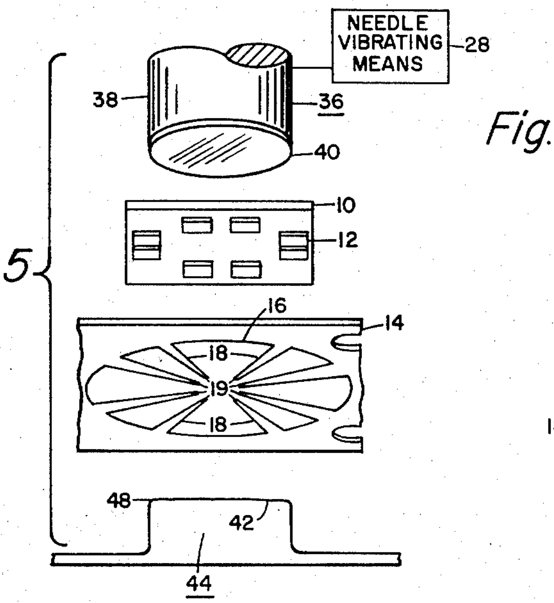
Fig. 6
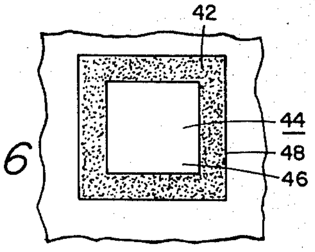
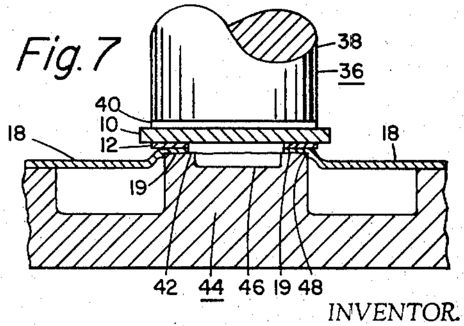
INVENTOR.
Donald F. Boyle
BY Mueller, Aichele & Rauner
ATTY'S

ULTRASONIC METALLIC SHEET-FRAME BONDING

BACKGROUND

This invention relates to the assembly of micro-electric devices including the contact bonding of leads to the bonding pads of integrated semiconductor circuits.

Various methods have been proposed for providing electrical connections between the ohmic contact areas of an integrated micro circuit and the external package leads. The most common method in current use involves the thermal compression bonding of extremely fine wires to the points to be interconnected. In accordance with this technique, a 14-lead device, for example, requires 28 separate bonding steps, each requiring a careful positioning of the partially assembled device in the bonding apparatus.

The industry has recognized for some time that it would be desirable to eliminate the time and expense of wire bonding. Considerable attention has been devoted to the expedient of simply extending the internal portion of the package leads and tapering the ends to provide bonding tips which are small enough for attachment directly to the bonding pads of the semiconductor structure. This approach has not been successful, primarily due to the fundamental difference in structural specification required for external package leads as compared with the specifications required for internal leads bonded to the ohmic-contact area of a micro circuit.

For example, the use of external package leads made of 10-mil Kovar has become a standard practice for many devices. Efforts to bond 10-mil Kovar leads directly to the electrodes of an integrated circuit have proved disappointing. High-speed techniques for gold or aluminum wire bonding such as thermal compression bonding and vibratory pressure welding, does not readily produce a reliable bond when applied to leads as thick as 10-mils, or when applied to metal leads which are less ductile than gold, aluminum or copper, for example. Even when acceptable bonds are initially formed using a 10-mil lead frame, the leads are very susceptible to inadvertent detachment from the die as a result of subsequent stresses introduced by normal handling and incidental flexing of the assembly.

It has also been proposed to replace bonding wires with individual rigid metal clips for interconnecting the bonding parts of the semiconductor circuit with the external leads. The approach may be advantageous for some applications, but it has not been found to reduce the cost of assembly substantially.

It is also known to deposit a metallic pattern of interconnecting leads on a ceramic base or other support, such that an integrated circuit bond having built-up electrodes may be inverted and contact bonded face down to the metallic patterns. This approach is objectionable because of high cost, and because the bonding sites are hidden from visual inspection. Therefore, any defective bond will escape detection until the device can be electrically tested.

As disclosed in an application for U.S. Letters Pat. Ser. No. 691,041 filed on Dec. 15, 1967 by Robert W. Helda and assigned to the assignee of this application, a substantially flat sheet-frame member of very thin metal having a plurality of inwardly extending fingers or leads have been provided for bonding leads to a chip. The ends or tips of the inwardly extending leads are positioned for alignment and bonding to the electrode bonding pads of the integrated circuit structure or chip. All the lead ends of the frame member are simultaneously bonded to corresponding electrode pads of the circuit structure in a single step, with a more effective use of high frequency vibrations to augment the welding. The high temperature required in thermal compression bonding is thereby avoided. The above application was abandoned subsequent to the filing of a continuation application on Oct. 13, 1970 as Ser. No. 80,378 which is pending. Reference is also made to the pending application of Robert W. Helda and Harry Geyer, Ser. No. 56,081, filed June 29, 1970, and owned by applicant's assignee Motorola, Inc. This latter application is a continuation of application Ser. No. 691,040 filed Dec. 15, 1967, which was abandoned subsequent to the filing of such continuing application Ser. No. 56,081.

The bonding is achieved by positioning the lead frame and the circuit die in proper alignment, that is, with each lead terminal in contact with a corresponding circuit bonding pad, and then applying bonding energy simultaneously to all bonding sites. Specifically, a pressure weld is formed simultaneously at each bonding pad by applying compressive force in combination with high-frequency vibrations. The bonding needle is applied to the reverse side of the circuit chip, opposite the bonding pads, whereby the vibrational energy passes through the semiconductor body and is transferred uniformly to all bonding sites. The face of the chip with each lead terminal in contact with a corresponding pad, is rigidly supported during the bonding step by a pedestal of a particular configuration.

In addition, since the lateral confinement of the several leads takes place due to their being part of a sheet-frame and since the bonding step involves a substantial deformation of the lead terminals, axial or longitudinal stress is introduced along the lead elements, sufficiently to cause a significant buckling of the leads in the direction of minimum resistance. A clearance is thereby provided between the leads and the edges of the circuit chip, which avoids the danger of electrical shorting.

The frame member is prepared from sheet aluminum or copper having a tensile strength of from 10,000 to 24,000 pounds per square inch and a thickness of from 1½ to 4 mils, preferably about 2 mils. However, other metals may be employed. The exact configuration of the leads may suitably be provided by chemical etching or mechanical stamping procedure well known in the art of metal fabrication. Advantageously, an elongated rectangular strip is provided which includes a plurality of identical frame members equally spaced along the length of the strip. The extreme flexibility of the first frame member permits it to be easily stored in the form of a continuous strip or belt wound on a spool, from which it is unwound for use as needed. The method further includes the step of aligning and bonding the electrodes of the circuit die to the lead terminals of the frame member by the simultaneous application of compressive force and high frequency vibrations to all bonding pads in a single step. The preferred technique is to employ needle having a flat tip of an area sufficient to contact a major portion of the area of the circuit die. The bonding needle tip is pressed against the reverse side of the circuit die, while rigid support means are provided on the face of the die to hold all the lead terminals in place on the bonding pads. In this manner, the bonding energy is transmitted through the circuit chip equally and simultaneously to all bonding sites. The bonding energy can instead be applied directly to the bonding sites by pressing the bonding needle against the face of the circuit die in contact with the lead ends. However, substantially improved results are obtained while applying the needle to the reverse side of the chip.

In order to obtain an efficient, uniform transfer of vibrational energy from the bonding needle to and through the semiconductor body, it has been found very helpful to roughen the surface of the needle tip and to roughen the reverse side of the semiconductor body. Also, the presence of gold or other soft metal on the reverse side of the chip has been avoided since it would reduce the efficiency of the transfer of energy. Bonding of the integrated circuit die to the leads of the first frame member is preferably carried out using automated equipment designed for operation on a lead frame supplying a continuous strip form as mentioned above. The strip including the bonded die can then be wound on a spool, if desired, for subsequent attachment to the secondary lead frame member. The degree of flexing which necessarily occurs during such an operation will impose sufficient stress upon the bonding sites to rupture a large percentage of the bonds if a lead frame member having the thickness required for external leads were used.

A second lead frame member is then provided, of relatively heavier gauge and of larger dimensions then the first frame member, the second frame member also having a plurality of inwardly extending fingers or leads. The leads of the second frame member provide the external electrical connections of the completed package. The terminals of the inwardly extending leads are adapted for alignment with some portion of each corresponding lead of the first frame member. The second frame member may be constructed of Kovar, nickel, copper, steel or other suitable metal, and is also preferably provided in the form of elongated rectangular strips consisting of a plurality of equally spaced identical units. The thickness of 6 to 12 mils is generally required for the second frame member and a tensile strength of at least 30,000 pounds per square inch.

The second frame member is then aligned in contact with the leads of the first frame member and corresponding leads are welded or otherwise attached to one another.

This invention relates to connection of the tips of the inwardly extending leads of the first frame to the bonding pads of the chip and does not relate to the fixing of the terminals of the inwardly extending leads of the second frame to the leads of the first frame.

As the bonding step is presently performed, the needle is of steel and the end thereof that is placed in contact with the chip is square. There is slipping of a steel needle with respect to the back of the chip when the steel needle is vibrated whereby the mechanical coupling of the needle to the chip is not complete, and it takes longer to provide good bonding between the leads and the chip than if there were no relative motion between the needle and the chip. In fact, silicon dust on the back of the chip may act as roller bearings, greatly lessening the mechanical coupling of the needle to the chip. Also, the slipping of the needle with respect to the chip may heat the chip to the point where it is damaged or destroyed. Furthermore, the square tip of the needle must be oriented with respect to the square chip whereby the lateral edges of the chip and the needle tip are parallel to avoid chipping the edges of the chip and also, the square needle size must not be too big or too small compared to the size of the chip whereby several sizes of square needles must be provided according to the present state of the art. Furthermore, the edge of the pedestal that contacts the leads, as presently used, is serrated at an angle of 45° to the side of the pedestal, to a depth of about 0.0007 of an inch, the serrations being about 0.002 of an inch apart, the serrations having a sharp tip or flat tips that are 0.0002 across. Such tips may cut through the leads with which they are in contact, thereby causing short circuits or substantially weakening the leads. In fact, use of such a pedestal may partially cut through the leads at the edges of the anvil, providing weak places in the leads. The sharp edge of the pedestal may impart a sharp corner between the compressed and the noncompressed portion of the inwardly extending leads. Also, such a pedestal, having the serrations mentioned on its working face, may be quite expensive to produce.

SUMMARY

In accordance with the invention, the needle is of steel having, however, a coating of copper on its contacting end. The copper coating acts as a non-slip coupling between the steel portion of the needle and the chip. If there be silicon dust on the back of the chip, the dust imbeds itself in the copper and does not act like roller bearings between the contact end of the needle and the chip. A needle which is all of copper does not impart motion to the chip as well as a steel needle having a copper coated tip because the copper needle bends with the vibratory force whereby the chip is not vibrated. Also, in accordance with the invention, the needle is cylindrical in form whereby no orientation thereof with respect to the chip is necessary other than alignment of the center of the chip with the center of the needle. Being cylindrical, one size of needle can be used with several sizes of chips. Such a steel needle having a coated tip costs in the order of 1/20th as much as the presently used steel needles having a square contacting face. Furthermore, the face of the pedestal is not serrated. The center portion of the square contact face of the pedestal is removed to a depth of a few thousandths of an inch, whereby only the peripheral edges of the pedestal contact the chip. The contacting peripheral portion of the end of the pedestal, which has a width slightly less than the width of a bonding pad on a chip, is vapor honed. The vapor honing roughens the contacting portion and increases its frictional coupling with the ends of the leads to the extent necessary to keep the tips of the leads stationary while the chip and the bonding pads thereof are vibrated. Due to this roughening, the area of contact of the pedestal to the lead tips is greatly increased over that produced by the serrated pedestals. The pressure between the lead tips and the pads combine with the relative motion of the leads and the bonding pads using the here described needle and pedestal causes the bonding of the leads to the bonding pads, without cutting or weakening the leads. The vapor honing of the raised portion of the pedestal rounds the edges thereof slightly, whereby the junction of the compressed portion of the leads and the adjoining portion of the leads is rounded and not sharp, whereby the leads are not weakened by the compression thereof. Furthermore, a pedestal of this invention costs about 1/6th of the cost of the serrated pedestal.

DESCRIPTION

The invention will be better understood when the following description thereof is read in connection with the accompanying drawing in which FIG. 1 is a greatly enlarged perspective view of an integrated circuit chip showing the bonding pads to which the leads are to be connected.

FIG. 2 is an enlarged view of a frame member in strip form.

FIG. 3 is an elevational view in cross section showing the simultaneous bonding of all the leads of the frame member to the corresponding bonding pads of the chip of FIG. 1 in accordance with the present prior art.

FIG. 4 is an enlarged plan view of the frame member and a chip, the leads of the frame member having been bonded to the chip.

FIG. 5 is an exploded view of the needle, the chip, the frame and the pedestal in position to bond the leads of the frame to the bonding pads of the chip, the needle and the pedestal being built according to this invention.

FIG. 6 is an enlarged plan view of the tip of the pedestal of this invention and FIG. 7 is an elevational view in cross section showing the simultaneous bonding of all the leads of the frame member of FIG. 2 to the corresponding bonding pads of the chip of FIG. 1 in accordance with this invention.

In FIG. 1, a chip 10 is shown to include eight bonding pads 12. The bonding pads 12 may be of aluminum or other suitable metal, and they are built up about 1 micron above the surrounding surface of the chip, care being taken to make the top surfaces of the pads 12 coplanar to thereby improve the reliability of the bonding of the ends of the leads to the pads. The details of the circuit deposited on the chip to which the pads are connected are not shown as being unnecessary for the understanding of this invention. It is clear that the pads may number more or less than eight.

FIG. 2 shows a geometric configuration of one embodiment of the lead-frame to be used in applying leads to the bonding pads 12 of the chip 10. The sheet metal strip 14 comprises a large number of identical lead frames or lead frame sections of which only the lead frame 16 is shown completely. The strip 14 is broken away through adjacent frames to indicate that as many frames are formed in the strip 14 as is convenient. The strip may be unwound from a roll, the pads 12 on the chip 10 may be bonded to the inner ends of leads of respective frames 16 and then the strip and chips may be wound as on another roll, all on one automatic machine or on semi-automatic machines. The resultant roll may then be taken to another machine for further processing such as adding the second frame. Each frame 16 includes a plurality of inwardly extending fingers or leads 18 having tips 19 corresponding in number to the number of pads 12 to which connections are to be made. Indicating holes 20 are provided to help provide accurate positioning and alignment of the lead frames 16 during the bonding action in which the tips 19 of the leads 18 are bonded to the respective bonding pads 12. Slots 22 are cut in the strip 14 to make the stiffness of the strip 14 uniform along the length thereof to facilitate rolling the patterned strip.

In the prior art shown in FIG. 3, a frame 16 is positioned on a pedestal 24. A chip 10 is positioned on the inner ends 19 of the leads 18 so that a bonding pad 12 registers with an end 19 of a corresponding lead 18, the chips 10 being upside down as compared to FIG. 1. A needle 26 of square cross section whose sides are aligned with the sides of the chip 10 presses down on the middle of the chip 10. The needle is vibrated laterally of its axis at a frequency of about 60,000 cycles per second over a distance of about 1/10,000th of an inch by known means such as is diagrammatically shown at 28. The chip 10 moves, except for the slippage mentioned above, with the needle 28. The serrations 30 on the contacting face of the pedestal 24 prevent the tips 19 of the leads 18 from moving. The pressure between the bonding pads 12 and the tips 19 of the leads 18 and the heat generated by the relative motion thereof causes bonding of the lead tips 19 to the bonding pads 12. At the same time, the lead tips 19 are flattened out and thereby lengthened and, of course, compressed, whereby the leads 18 bend down, as shown in FIG. 3, to take up the added length, since the frame 16 itself confines the outward end of the leads 18. While the bonding operation of FIG. 3 operates quite well, still there is slipping between the needle 26 and the chip 10 whereby all the motion applied to the needle is not applied to the pad 12 and the chip is heated. This slippage is augmented by silicon dust on the back of the chip, this dust acting as ball bearings between the needle 26 and the chip 10. Also, the serrations 30 cut through some and part way through all of the lead tips 19 often causing a defective product in that a lead 18 may not be connected to a pad 12 or a lead 18 may be so weakened that upon later operation on the leads 18, a tip 19 may break away from the lead 18. There is also a tendency for the material of the tip 19 to stick to the serrations, whereby removing a chip 10 with its leads intact from the serrations 30 is sometimes difficult. Furthermore, when the tips of the leads are squeezed, the junction of the thin portion and unthinned portion of the lead 18 will take the square shape of the edge of the pedestal 24 whereby this junction is weakened.

As shown in FIGS. 5, 6 and 7 and in accordance with this invention, the needle 36 has a cylindrical steel shank 38 and also has a coating of a soft metal such as copper 40 on the contacting end of the needle 36. The steel shank 38 of the needle 36, being rigid, applies the vibratory motion produced by the vibrator 28 to the copper coating 40. The coating 40 acts as a non-slip coating with respect to the chip 10 whereby the vibrating force is imparted with very little slippage to the chip 10. The copper coating 40 is sufficiently soft so that the silicon dust, if any, on the back of the chip 10 imbeds itself in the copper and does not act as a roller bearing.

The round shape of the needle 36 makes it only necessary to center the needle with respect to the chip but no orientation is necessary as between the chip 10 and the needle 36. Furthermore, one size of round needle services several sizes of chips.

Also as shown in FIG. 5, and as better shown in FIGS. 6 and 7, there are no serrations on the top 42 of the pedestal 44. Instead, the top 42 of the pedestal 44 is vapor honed, that is, it is in effect blasted by very fine particles of abrasive, whereby the complete contacting surface 42 is roughened. However, there are no sharp peaks or edges thereon and the difference in elevation of the various parts of the contact surface is much less than the depth of the serrations 30. Furthermore, the outside edge 48 of the contacting surface 42 is slightly rounded. Also, if desired and as shown in FIGS. 6 and 7, the end of the pedestal 44 is hollowed out at 46 as by cathodic erosion, whereby the contacting surface takes the form of a ridge 42 around the periphery of the pedestal 44, the width of the ridge 42, except in the corners, being about equal to the width of the pads 12. Due to the lack of serrations on the pedestal of FIGS. 5 to 7, the tips 19 of the leads 18 are not cut and they are thinned only slightly. However, the rough surface provided by the vapor honing prevents motion of the tips 19 with respect to the pedestal 44 whereby the pads 12 and the tips 19 are better bonded, with less weak or cut bonds being produced than when the pedestal of FIG. 3 is used. Furthermore, the rounding of the edges 48 of the contacting face 42 rounds the junction of the thin portion of the tips 19 and the leads 18, also resulting in better yield of good bonds. Furthermore, the hollowing out 46 of the face 42 concentrates the pressure and vibratory motion along the portion of face 42 that will be in contact with the tips 19, producing the bonding action with less total pressure on the needle than when using needle 26 of FIG. 3.

The needle 36 is cheap to make since it is round. It lasts indefinitely since only the copper layer 40 wears. When this layer 40 is worn thin, it is replaced on the round shank 38 at low cost. The pedestal 24 is made of a very hard material so that putting serrations 30 on its face is an expensive proceeding. The pedestal 44 made as described, that is by vapor honing the face rather than serrating it, costs about 1/6th of the cost of a pedestal 24. When the serrations 30 are worn down, the pedestal is discarded. A pedestal 44 lasts many times as long as a pedestal 24. The needle 36 and the pedestal 44 of this invention when used to bond tips 19 of leads 18 to bonding pads 12 produces a substantially greater yield of good bonds than a needle 26 used with a pedestal 24 and at a substantially reduced cost. In the art of producing integrated circuits, which are made in great quantities by automatic or semiautomatic machines, this reduction in cost is of great economic importance providing a great competitive advantage.

I claim:

1. The method of bonding substantially simultaneously a group of metal leads to a corresponding plurality of bonding pads on a semiconductor chip and utilizing an ultrasonically vibrating needle for said bonding, comprising providing a frame member which can be independently handled as a unit and which has a plurality of said groups of metal leads therewith, each such lead having a bonding portion at its inner end for bonded connection to a corresponding chip pad, positioning said frame member in bonding apparatus with a group of leads on a pedestal, which pedestal has a configuration at its surface and has a surface of such physical condition that the lead bonding portion of each lead in a group of leads is both supported on said pedestal surface and maintained in a fixed position thereon during an ultrasonic bonding operation, positioning a chip on said group of leads with the chip contact pads engaging corresponding lead bonding portions, and said chip having said ultrasonically vibrating needle in engagement with the face of said chip opposite to that face having the bonding pads thereon with the end face of said needle having a physical condition such that it moves the chip in a lateral direction therewith relative to the lead bonding portions during a bonding operation of the needle, applying pressure to maintain the chip contact pads and lead bonding portions in engagement and applying vibratory energy to said needle to move the latter in a lateral direction at ultrasonic speed, with said lead bonding portions remaining fixed on said pedestal and said chip remaining fixed relative to said needle but movable with said needle relative to said lead bonding portions to substantially simultaneously bond said pads and lead portions together, and moving said frame member independently after bonding a chip to each said group of leads to provide an assembly in said frame member for each said group whereby to permit subsequent use of each such assembly.

2. The method of bonding as defined in claim 1, wherein the face surface of the semiconductor chip engaged by the bonding needle is physically conditioned so as to cooperate with the end face of said needle in providing the gripping to move the chip laterally in a vibratory pattern as the needle moves in a bonding operation.

3. The method of bonding as defined in claim 1, wherein the metal of the leads for each group of leads in the frame member has a tensile strength of from 10,000 to 24,000 pounds per square inch and a thickness of from 1½ to 4 mils.

4. The method of bonding as defining in claim 3, wherein the metal of the leads is one of the class comprising aluminum and copper.

5. The method of bonding as defined in claim 1, wherein the frame member is originally provided for the bonding operation in the form of a continuous strip wound on a spool to be removed from the spool as needed for bonding.

6. The method of bonding as defined in claim 1, wherein the pedestal has a vapor-honed surface upon which the lead bonding portions are supported.

7. The method of bonding as defined in claim 1, wherein the end face of the needle has a surface softer than the material of the shank of that needle.

* * * * *